(12) United States Patent
Jeoung et al.

(10) Patent No.: US 9,444,217 B2
(45) Date of Patent: Sep. 13, 2016

(54) LASER LIGHT SOURCE DEVICE

(71) Applicant: LG ELECTRONICS INC., Seoul (KR)

(72) Inventors: Byungwoo Jeoung, Seoul (KR); Yongwoo Bae, Seoul (KR); Sangok Yeo, Seoul (KR); Seunggyu Lee, Seoul (KR)

(73) Assignee: LG Electroncis Inc., Seoul (KR)

( * ) Notice: Subject to any disclaimer, the term of this patent is extended or adjusted under 35 U.S.C. 154(b) by 0 days.

(21) Appl. No.: 14/761,218

(22) PCT Filed: Nov. 7, 2013

(86) PCT No.: PCT/KR2013/010041
§ 371 (c)(1),
(2) Date: Jul. 15, 2015

(87) PCT Pub. No.: WO2014/163269
PCT Pub. Date: Oct. 9, 2014

(65) Prior Publication Data
US 2015/0357790 A1    Dec. 10, 2015

(30) Foreign Application Priority Data

Apr. 1, 2013   (KR) .................. 10-2013-0035217

(51) Int. Cl.
| | |
|---|---|
| *H01S 5/022* | (2006.01) |
| *F21V 9/16* | (2006.01) |
| *F21V 7/00* | (2006.01) |
| *H01S 5/323* | (2006.01) |
| *F21K 99/00* | (2016.01) |
| *F21V 5/04* | (2006.01) |
| *F21Y 101/02* | (2006.01) |
| *H01S 5/024* | (2006.01) |

(52) U.S. Cl.
CPC ............ *H01S 5/02296* (2013.01); *F21K 9/56* (2013.01); *F21V 5/04* (2013.01); *F21V 7/0066* (2013.01); *F21V 9/16* (2013.01); *H01S 5/32341* (2013.01); *F21V 7/0008* (2013.01); *F21Y 2101/025* (2013.01); *H01S 5/02208* (2013.01); *H01S 5/02469* (2013.01)

(58) Field of Classification Search
CPC ........ H01S 5/02296; H01S 5/02; H01S 5/06; H01S 5/32341
See application file for complete search history.

(56) References Cited

U.S. PATENT DOCUMENTS

| | | | | |
|---|---|---|---|---|
| 8,702,286 | B2 * | 4/2014 | Nakazato | ............. F21S 48/1145 362/510 |
| 2009/0052158 | A1 | 2/2009 | Bierhuizen et al. | |
| 2012/0099184 | A1 | 4/2012 | Horikawa et al. | |

(Continued)

FOREIGN PATENT DOCUMENTS

| | | |
|---|---|---|
| JP | 2006-278383 A | 10/2006 |
| JP | 2012-231183 A | 11/2012 |

(Continued)

*Primary Examiner* — Dung Nguyen
(74) *Attorney, Agent, or Firm* — Birch, Stewart, Kolasch & Birch, LLP

(57) ABSTRACT

A laser diode includes a laser diode emitting light due to an electrical signal; a wavelength conversion plate for shifting the wavelength of the light emitted from the laser diode; a reflecting part for reflecting the light emitted from the laser diode towards the wavelength conversion plate; and a projecting part for emitting, in the forward direction, the light shifted by the wavelength conversion plate. The laser diode can provide a high-power but small-sized laser light source device, and a narrow emission angle can be achieved using the laser diode.

24 Claims, 14 Drawing Sheets

(56) References Cited

U.S. PATENT DOCUMENTS

2012/0292644 A1 11/2012 Cho et al.
2014/0151736 A1 6/2014 Narendran et al.

FOREIGN PATENT DOCUMENTS

| KR | 10-2010-0063081 A | 6/2010 |
| KR | 10-2012-0129688 A | 11/2012 |

* cited by examiner

LASER LIGHT SOURCE DEVICE

BACKGROUND OF THE INVENTION

1. Technical Field

The present invention relates to a high-power and small-sized laser light source device emitting light having straightness using blue or ultraviolet laser diodes.

2. Background Art

Light emitting diodes (LEDs) have been developed as conventional leading light sources and are being used as main light sources and continuously developed now. However, LEDs have a large light exit angle and efficiency which is reduced at high current and are restricted as a light source of a high power illumination device or a laser light source device emitting light toward a small area.

Owing to such restriction, instead of LEDs, a high-intensity discharge (HID) lamp, a metal halide lamp, an ultra high performance (UHP) lamp and the like are used as high power light sources. However, since the laser light source device has problems, such as a short lifespan, environmental regulation, low efficiency and the like, a new light source substituting for the laser light source device is required.

SUMMARY OF THE INVENTION

An object of the present invention is to provide a high-power and small-sized laser light source device emitting light having straightness using blue or ultraviolet laser diodes.

In one embodiment of the present invention, a laser light source device includes laser diodes configured to emit light according to an electrical signal, a wavelength conversion plate configured to convert the wavelength of the light emitted from the laser diodes, a reflection unit configured to reflect the light emitted from the laser diodes to the wavelength conversion plate, and a projection unit configured to emit light converted by the wavelength conversion plate in the forward direction.

The wavelength conversion plate and the laser diodes may be located on the same plane and face in the forward direction.

The laser diodes may be prepared in plural number and disposed in a circular shape and the wavelength conversion plate may be located at the center of the laser diodes.

Further, the reflection unit may be formed in a ring shape or a circular shape at the arrival position of the light emitted from the laser diodes disposed in the circular shape.

The reflection unit may employ an anisotropic coating layer configured to reflect the light of the wavelength emitted from the laser diodes and to transmit the light of the wavelength converted by the wavelength conversion plate.

The wavelength conversion plate may employ an optoceramic plate including a phosphor.

The wavelength conversion plate may include a reflection plate provided on the rear surface of the optoceramic plate.

The reflection plate may be an aluminum thin film provided with one surface thereof contacting the optoceramic plate and coated with silver.

The phosphor may be at least one of a YAG-based phosphor, a LuAG-based phosphor and an oxynitride phosphor.

The wavelength conversion plate may be disposed in a circular shape on a rotary plate, the light reflected by the reflection unit may be supplied to a part of the wavelength conversion plate on the rotary plate, and the rotary plate may be rotated so that the position of the wavelength conversion plate receiving the reflected light is changed.

The projection unit may be a lens disposed on the front surfaces of the laser diodes and the wavelength conversion plate.

Here, the reflection unit may be an anisotropic coating layer applied to a part of the lens to reflect the light of the wavelength emitted from the laser diodes and to transmit the light of the wavelength converted by the wavelength conversion plate.

The lens may be a collimating lens configured to guide the light converted by the wavelength conversion plate so as to emit the light straightly in the forward direction.

The collimating lens may include an incidence surface configured to cover the laser diodes and the wavelength conversion plate, an exit surface configured to emit the light converted by the wavelength conversion plate in the straight direction, opposite to the incidence surface, and a reflective surface configured to reflect converted light incident upon the incidence surface to the exit surface.

The anisotropic coating layer may be applied to at least a part of the incidence surface.

The lens may be a plus lens or a condensing lens and the anisotropic coating layer may be formed on one surface of the lens.

The reflection unit may be a reflecting mirror having a reflective surface in the form of a concave mirror and the projection unit may be a parabolic mirror formed at the circumference of the wavelength conversion plate and configured to emit light reflected by the wavelength conversion plate in the forward direction.

The reflecting mirror may be provided with an opening formed at the center thereof and configured to emit light reflected by the parabolic mirror through the opening.

The laser light source device may further include a radiation fin formed on the rear surface of the wavelength conversion plate and the rear surfaces of the laser diodes.

The laser diodes may be blue laser diodes or ultraviolet laser diodes and the light of the wavelength converted by the wavelength conversion plate may be one of red light, green light and yellow light.

In another embodiment of the present invention, a laser light source device includes a laser diode configured to emit light according to an electrical signal, a wavelength conversion plate disposed such that one surface thereof contacts the front surface of the laser diode and configured to convert the wavelength of the light emitted from the laser diode, and a first anisotropic coating layer coated on one surface of the wavelength conversion plate so as to transmit the light of the wavelength emitted from the laser diode and to reflect the light of the wavelength converted by the wavelength conversion plate.

The laser light source device may further include a second anisotropic coating layer coated on the other surface of the wavelength conversion plate so as to transmit at least a part of the light of the wavelength converted by the wavelength conversion plate.

The wavelength conversion plate may be a ceramic plate including a phosphor.

The laser light source device may further include a condensing lens formed on the front surface of the wavelength conversion plate so as to condense the light of the converted wavelength and to emit the condensed light in parallel.

The light emitted from the laser diode may have a wavelength corresponding to blue light or ultraviolet light and the light of the wavelength converted by the wavelength conversion plate may be one of red, green and yellow light.

At least one embodiment of the present invention may provide a high-power and small-sized laser light source device which has a narrow light exit angle using laser diodes.

DETAILED DESCRIPTION OF THE EMBODIMENTS

Hereinafter, a laser light source device in accordance with the present invention will be described in detail with reference to the accompanying drawings.

Figure 1:
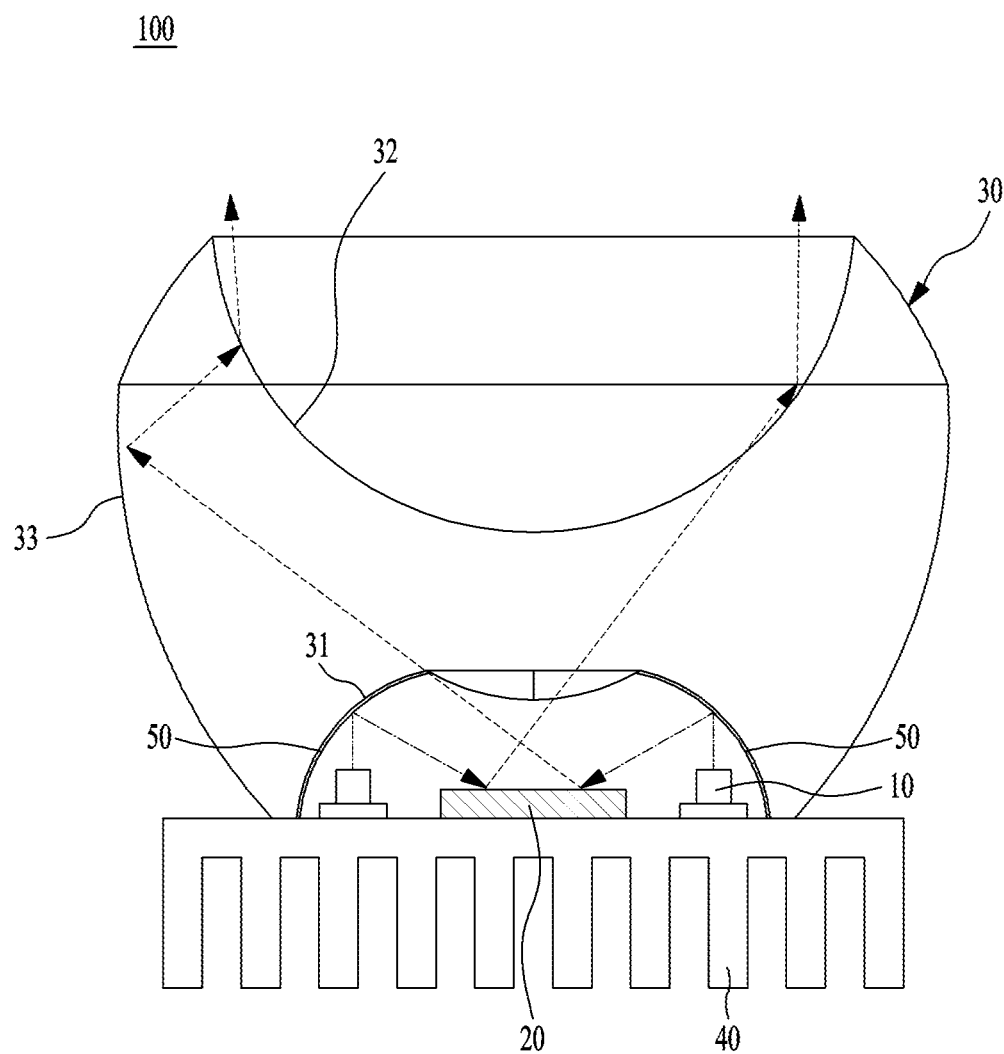
FIG. 1 is a cross-sectional view illustrating a laser light source device in accordance with one embodiment of the present invention.
Figure 2:
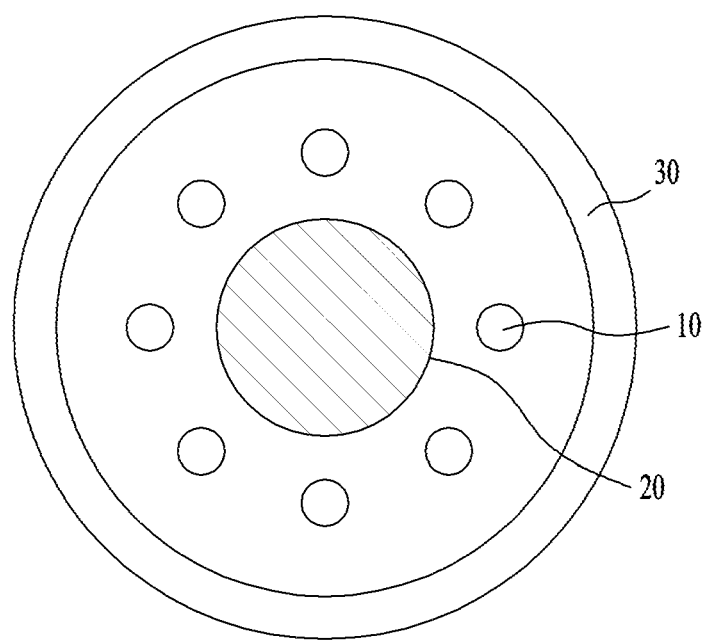
FIG. 2 is a plan view of the laser light source device in accordance with the embodiment of FIG. 1.

FIG. 1 is a cross-sectional view illustrating a laser light source device 100 in accordance with one embodiment of the present invention, and FIG. 2 is a plan view of the laser light source device 100 in accordance with the embodiment of FIG. 1. With reference to FIGS. 1 and 2, laser diodes 10, a wavelength conversion plate 20, a reflection unit 50, a projection unit 30, and a radiation fin 40 are illustrated.

The laser diode 10 is a semiconductor element emitting light according to an electrical signal. The laser diode 10 emits light of a narrow wavelength band, as compared to a light emitting diode, and the emitted light has straightness.

Since the laser diode 10 amplifies light and then emits the amplified light, the laser diode 10 has a high power, as compared to a light emitting diode, has a small size, as compared to a conventional laser device, and low power consumption. Further, the laser diode 10 is operable at a high speed and the blue laser diode 10 or the ultraviolet laser diode 10 has efficiency which is not reduced at high current.

As exemplarily shown in FIG. 2, a plurality of laser diodes 10 may be disposed in a circular shape and the wavelength conversion plate 20 may be disposed at the center of the circularly disposed laser diodes 10 so that light emitted from the laser diodes 10 may be concentrated upon the wavelength conversion plate 20 using the reflection unit 50.

The wavelength conversion plate 20 is a sheet-type member including a phosphor converting the wavelength of light emitted from the laser diodes 10 to change color. Conventionally, a method in which a phosphor in the form of powder is mixed with an organic binder, such as silicon resin, and the mixture is applied to a platy member so as to form a plate is commonly used. However, silicon resin has low thermal stability and is thus difficult to be applied to high power light supplied from the laser diodes 10.

The present invention uses an optoceramic plate 21 including a phosphor as the wavelength conversion plate 20. The optoceramic plate 21 includes the phosphor in ceramic itself and, thus, does not require mixing with a silicon binder and has excellent thermal stability.

A converted wavelength band varies according to the phosphor included in the optoceramic plate 21. A YAG-based phosphor, such as $(Y1\text{-}x\text{-}yGdxCey)_3Al_5O1_2$, $(Y1\text{-}xCex)_3Al_5O1_2$, $(Y1\text{-}xCex)_3(Al1\text{-}yGay)_5O1_2$ or $(Y1\text{-}x\text{-}yGdxCey)_3(Al1\text{-}zGaz)_5O1_2$, a LuAG-based phosphor, such as $(Y1\text{-}x\text{-}yLuxCey)_3Al_5O1_2$, a silicate-based phosphor, such as $(Sr,Ca,Ba,Mg)_2SiO_4{:}Eu$, and an oxide phosphor, such as $(Ca,Sr)Si_2N_2O_2{:}Eu$, may be used as a phosphor converting emitted light into yellow light when blue laser diodes 10 or ultraviolet laser diodes 10 emit light.

Further, a LuAG-based phosphor, such as $(Y1\text{-}x\text{-}yLuxCey)_3Al_5O1_2$, may be used as a phosphor converting emitted light into green light when blue laser diodes 10 or ultraviolet laser diodes 10 emit light. In addition, $Y_3(Al,Ga)_5O_{12}{:}Ce$, $CaSc_2O_4{:}Ce$, $Ca3(Sc,Mg)_2Si_3O1_2{:}Ce$, $(Sr,Ba)_2SiO_4{:}Eu$, $(Si,Al)_6(O,N)_8{:}Eu(\beta\text{-sialon})$, $(Ba,Sr)_3Si_6O1_2N_2{:}Eu$, $SiGa_2S_4{:}Eu$, $BaMgAl_{10}O_{17}{:}Eu$, or Mn may be used.

Further, $(Ca,Sr,Ba)_2Si_5(N,O)_8{:}Eu$, $(Ca,Sr,Ba)Si(N,O)_2{:}Eu$, $(Ca,Sr,Ba)AlSi(N,O)_8{:}Eu$, $(Sr,Ba)_3SiO_5{:}Eu$, $(Ca,Sr)S{:}Eu$, $(La,Y)_2O_2S{:}Eu$, $K_2SiF_6{:}Mn$, or CaAlSiN:Eu may be used as a phosphor converting emitted light into red light when blue laser diodes 10 or ultraviolet laser diodes 10 emit light.

Figure 3:
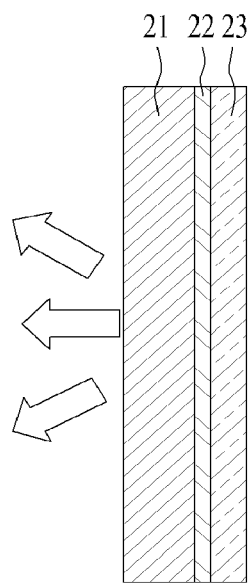
FIG. 3 is a longitudinal-sectional view of a wavelength conversion plate in accordance with the present invention.

FIG. 3 is a longitudinal-sectional view of the wavelength conversion plate 20 in accordance with the present invention. The wavelength conversion plate 20 includes the optoceramic plate 21 including a phosphor converting a wavelength and a reflection plate 23 disposed on the rear surface of the optoceramic plate 20 to reflect light.

The reflection plate 23 may employ a metal plate, such as an aluminum plate, and a silver coating layer 22 may be interposed between the optoceramic plate 22 and the reflection plate 23 so as to increase reflection efficiency. Light, which is incident upon the optoceramic plate 21 so that the wavelength of the light is converted, is reflected by the reflection plate 23 and is emitted in the forward direction.

The reflection unit 50 transmits light emitted from the laser diode 10 to the wavelength conversion plate 20. In this embodiment, since both the laser diodes 10 and the wavelength conversion plates 20 face the front, the reflection unit 50 is used to reflect light emitted from the laser diodes 10 toward the wavelength conversion plate 20.

In this case, in order to reflect light emitted from the laser diodes 10 toward the wavelength conversion plate 20, the reflection unit 50 is disposed in front of light emitted from the laser diodes 10. As exemplarily shown in FIG. 2, the reflection unit 50 is disposed so as to condense light, emitted from the laser diodes 10 disposed in a circular shape, upon the wavelength conversion plate 20.

Here, when light, the wavelength of which has been converted by the wavelength conversion plate 20, is emitted to the reflection unit 50, emission of light to the front region is difficult. In order to solve such a problem, an anisotropic coating layer may be used as the reflection unit 50 so as to reflect light supplied from the laser diodes 10 and to transmit light of the converted wavelength.

Light of the wavelength converted by the wavelength conversion plate 20 is transmitted by the anisotropic coating layer of the reflection unit 50 and emitted in the forward direction through the projection unit 30. The projection unit 30 may be a lens or a mirror projecting light in the forward direction and, in the embodiment of FIG. 1, a collimating lens is used. The collimating lens of the projection unit 30 is a lens projecting light parallel in one direction and is not limited to the shape shown in FIG. 1.

The collimating lens of the projection unit 30 may include an incidence surface 31 disposed opposite the laser diodes 10 and the wavelength conversion plate 20, an exit surface 32, through which light converted by the wavelength conversion plate 20 is emitted in a straight direction, opposite to the incidence surface 31, and a reflective surface 33 reflecting the converted light incident upon the incidence surface 31 to the exit surface.

Light emitted from the laser diodes 10 and light reflected by the wavelength conversion plate 20 are incident upon the incidence surface 31, and the above-described anisotropic coating layer of the reflection unit 50 is applied to at least a part of the incident surface 31 and thus transmits only the light reflected by the wavelength conversion plate 20 and reflects the light emitted by the laser diodes 10.

Light transmitted from the incidence surface 31 directly to the exit surface is emitted from the exit surface straightly in the forward direction, but light transmitted in other directions is difficult to emit straightly in the forward direction and thus, the reflective surface 33 to reflect the light to the exit surface is provided.

Figure 4:
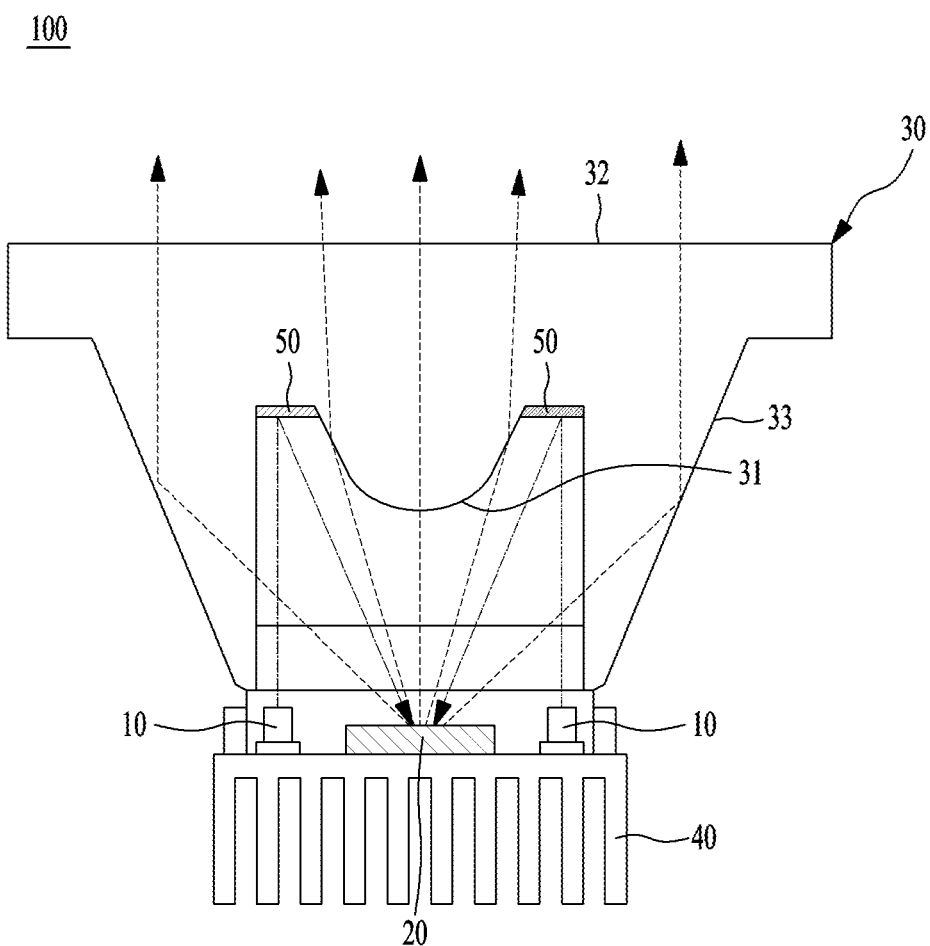
FIG. 4 is a cross-sectional view illustrating a laser light source device in accordance with another embodiment of the present invention.

The collimating lens of the projection unit 30 is not limited to the shape shown in FIG. 1. FIG. 4 is a cross-sectional view illustrating a laser light source device 100 in accordance with another embodiment of the present invention, using a collimating lens of the projection unit 30 having another shape. In the collimating lens of the projection unit 30 shown in FIG. 4, an anisotropic coating layer of the reflection unit 50 may be applied to a part of an incidence surface 31 and be formed in a donut shape along the circular-shaped arrangement of laser diodes 10.

Light of a wavelength converted by a wavelength conversion plate 20 may be emitted directly through an exit surface via the incidence surface 31 or be reflected by a reflective surface and emitted in parallel through the exit surface.

Figure 5:
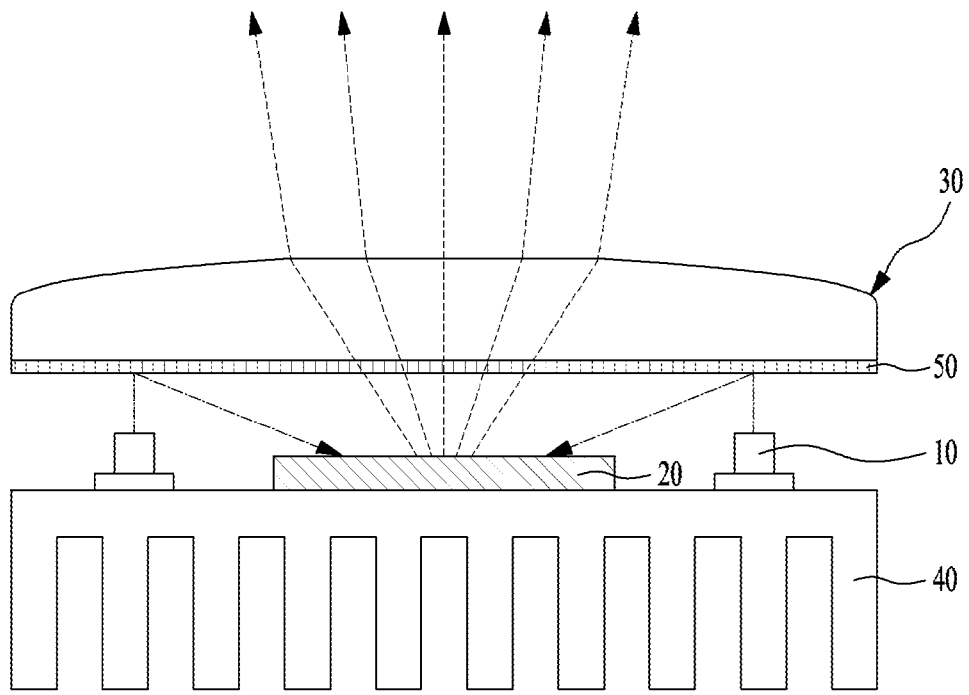
FIG. 5 is a cross-sectional view illustrating a laser light source device in accordance with another embodiment of the present invention.
Figure 6:
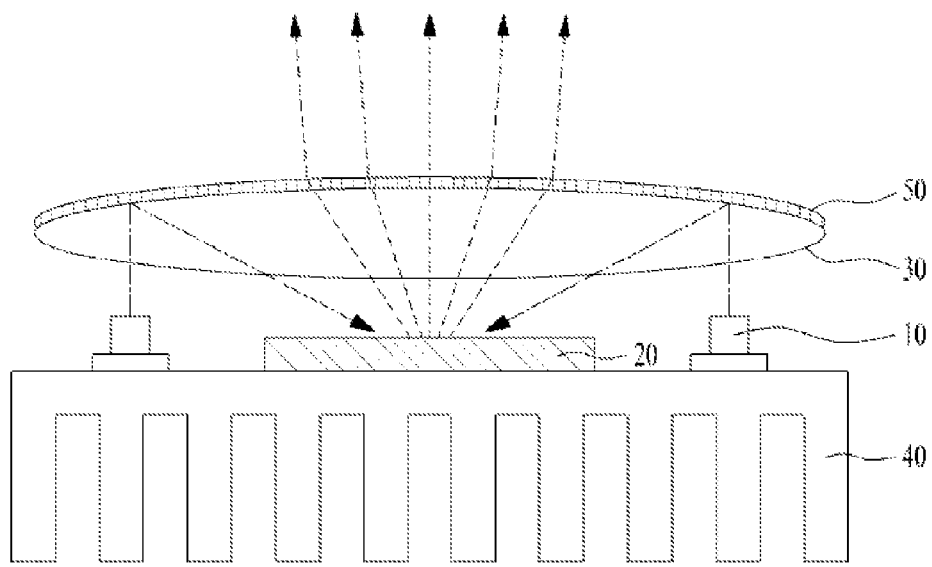
FIG. 6 is a cross-sectional view illustrating a laser light source device in accordance with another embodiment of the present invention.

FIGS. 5 and 6 illustrate a plus lens or a condensing lens serving to condense spreading light. When the refractive index of the plus lens or the condensing lens of FIGS. 5 and 6 is adjusted, light having straightness may be emitted.

FIG. 5 illustrates a laser light source device in accordance with another embodiment of the present invention, in which an anisotropic layer of the reflection unit 50 is formed on an incidence surface of a lens of the projection unit 30, and FIG. 6 illustrates a laser light source device in accordance with another embodiment of the present invention, in which an anisotropic layer of the reflection unit 50 is formed on an exit surface. That is, a reflection unit may be formed by forming the anisotropic coating layer of the reflection unit 50 on one of the incidence surface and the exit surface.

The laser diodes 10 generate a large amount of heat when the laser diodes 10 emit light, the wavelength conversion plate 20 has an increase in temperature and efficiency, which is lowered when condensed light is continuously supplied to the wavelength conversion plate 20, and, thus, a heat radiation structure may be added. Therefore, as exemplarily shown in FIGS. 1, 4 and 6, the radiation fin 40 may be provided on the rear surfaces of the laser diodes 10 and the wavelength conversion plate 20 so as to prevent increase in the temperature of the laser diodes 10 and the wavelength conversion plate 20.

The laser diodes 10 and the wavelength conversion plate 20 may be located on the same plane and the radiation fin 40 may be formed in an integrated type. The radiation fin 40 may be formed of a metal having high thermal conductivity and include a plurality of fins or ribs so as to increase a surface area.

Figure 7:
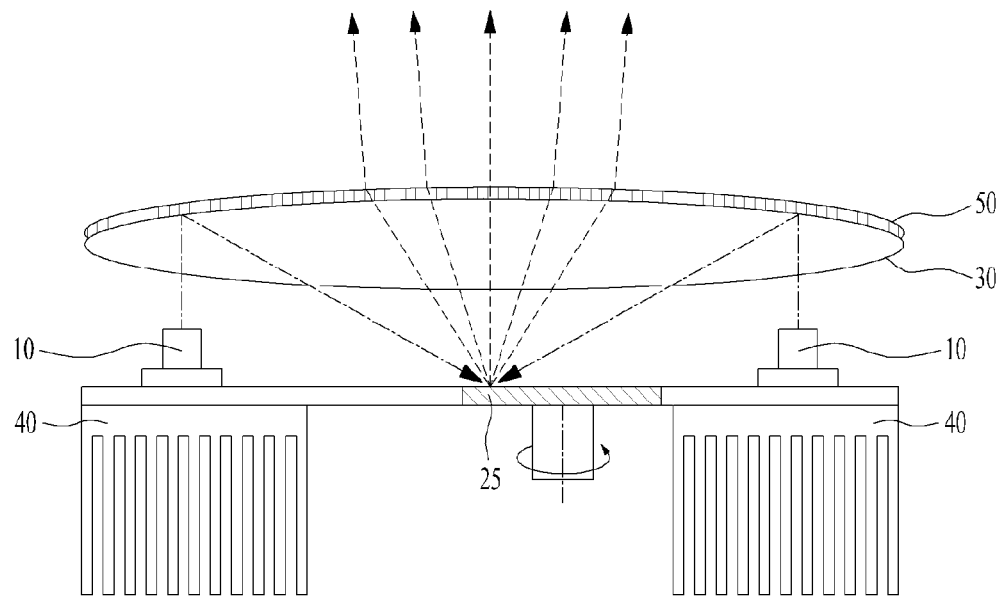
FIG. 7 is a cross-sectional view illustrating a laser light source device in accordance with another embodiment of the present invention.
Figure 8:
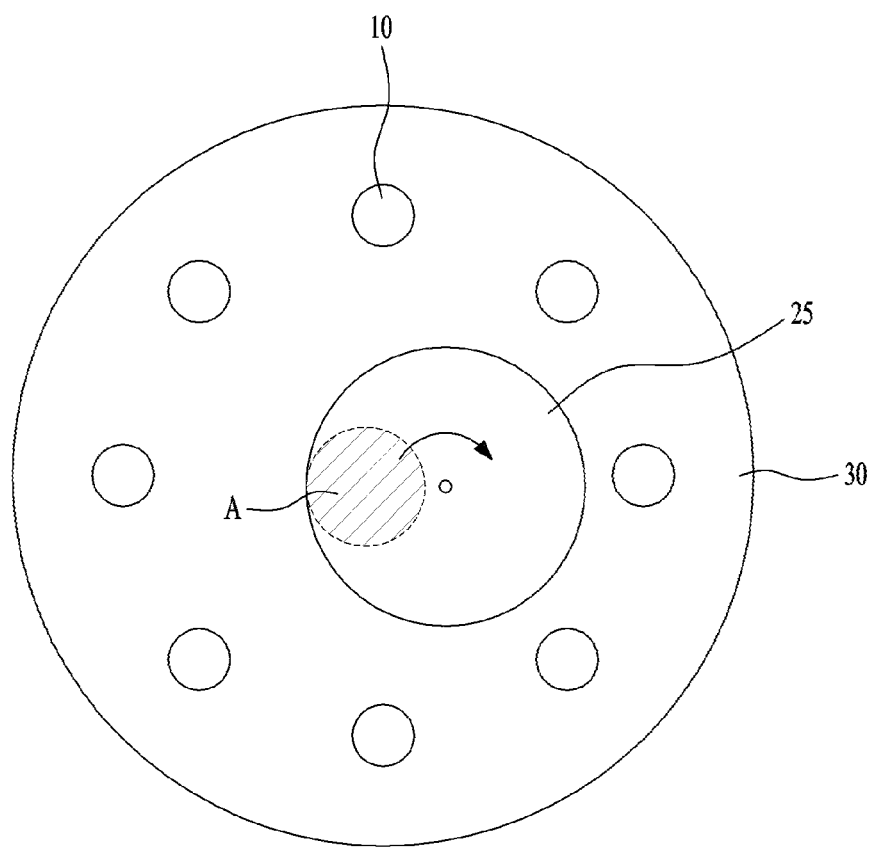
FIG. 8 is a plan view of the laser light source device in accordance with the embodiment of FIG. 7.

FIG. 7 is a cross-sectional view illustrating a laser light source device 100 in accordance with another embodiment of the present invention and FIG. 8 is a plan view of the laser light source device 100 in accordance with the embodiment of FIG. 7. In this embodiment, a wavelength conversion plate 25 in the form of a rotary plate is provided. In order to emit parallel light in the forward direction, light needs to be condensed upon the wavelength conversion plate 25 of a specific area A and emitted in the forward direction in consideration of an exit angle of the light.

However, when light of a designated amount or more is supplied to the wavelength conversion plate, efficiency of the wavelength conversion plate is lowered. That is, on the assumption that wavelength conversion efficiency to one laser diode 10 is 100%, wavelength conversion efficiency to six laser diodes 60 is lowered to 60%.

In this embodiment, from the viewpoint of fatigue of the wavelength conversion plate, in order to solve such a problem, the wavelength conversion plate 25 is rotated so that the wavelength conversion plate 25 having a broad area is uniformly used and thus, efficiency thereof may be increased.

As exemplarily shown in FIG. 8, if light emitted from the laser diodes 10 is reflected by the reflection unit 50 and condensed upon the area A, when the wavelength conversion plate 25 is rotated, the position of the wavelength conversion plate 25 located in the area A is changed and, thus, fatigue of the wavelength conversion plate 25 is decreased. Further, since light is not consistently supplied to the same position, increase in temperature may be solved and the radiation fin 40 for the wavelength conversion plate used in the above-described embodiments may be omitted.

Figure 9:
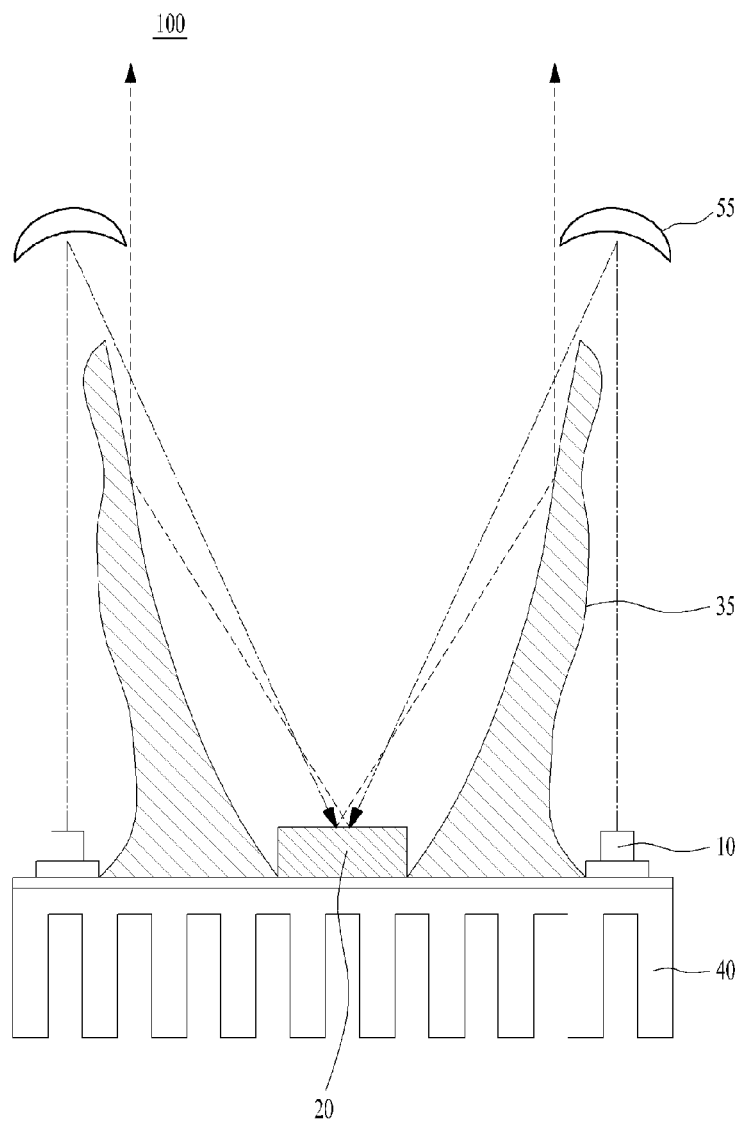
FIG. 9 is a cross-sectional view illustrating a laser light source device in accordance with another embodiment of the present invention.
Figure 10:
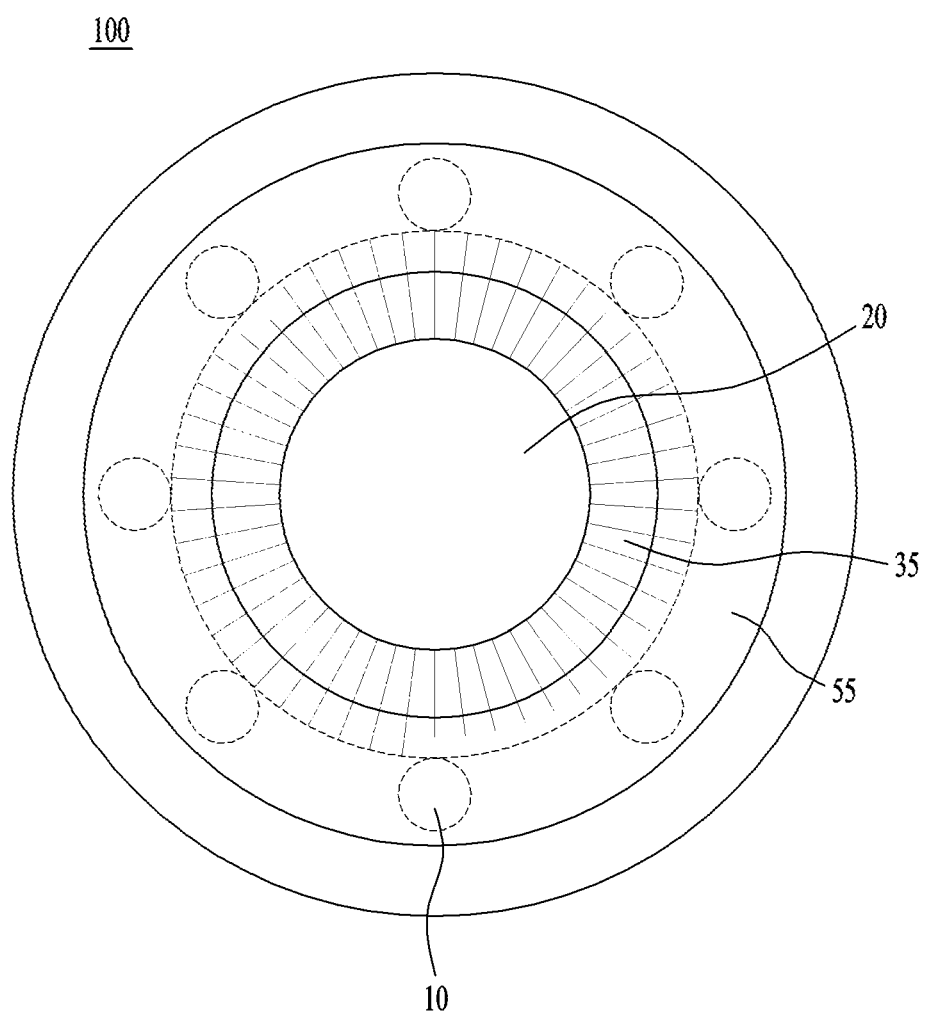
FIG. 10 is a plan view of a lamp in accordance with the embodiment of FIG. 9.

FIG. 9 is a cross-sectional view illustrating a laser light source device 100 in accordance with another embodiment of the present invention and FIG. 10 is a plan view of the laser light source device 100 in accordance with the embodiment of FIG. 9. In this embodiment, a parabolic mirror 35 is used as a projection unit 30 and a reflecting mirror 55 is used as a reflection unit 50.

The reflecting mirror 55 is positioned opposite laser diodes 10 and disposed at an angle of reflecting light incident from the laser diodes 10 to a wavelength conversion plate 20. The reflecting mirror 55 may be disposed in a donut shape, as exemplarily shown in FIG. 10, corresponding to the laser diodes 10 disposed in a circular shape. The reflective surface of the reflecting mirror 55 may be formed in the shape of a concave mirror so as to condense light upon a narrow area.

In order to reflect light, the wavelength of which has been converted by the wavelength conversion plate 20, and thus to emit the light parallel in the forward direction, the parabolic mirror 35 may be used as the projection unit. The parabolic mirror 35 is a kind of concave mirror having a curved surface emitting light in parallel through the center thereof, and emits light, the wavelength of which has been converted by the wavelength conversion plate 20, parallel in the forward direction.

Figure 11:
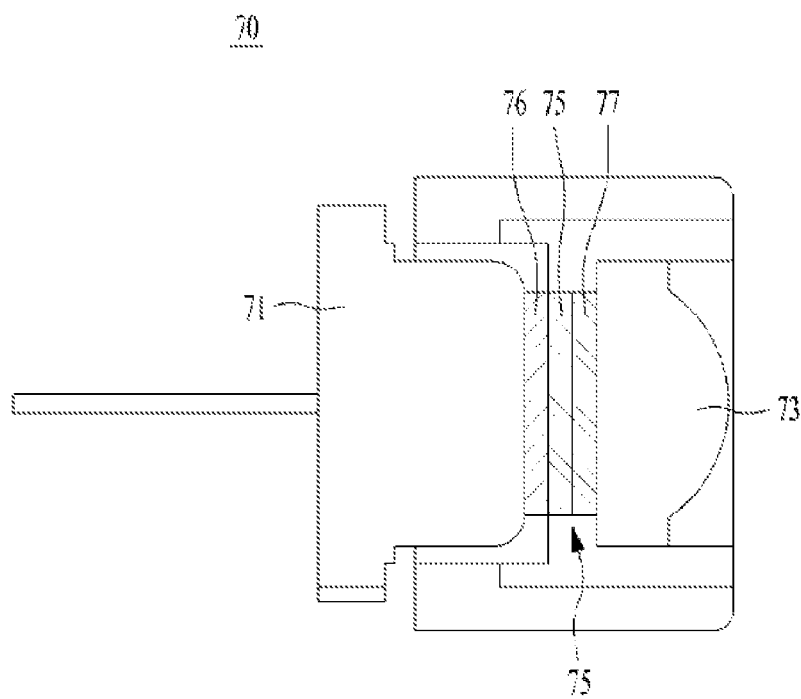
FIG. 11 is a cross-sectional view illustrating a lamp in accordance with yet another embodiment of the present invention.
Figure 12:
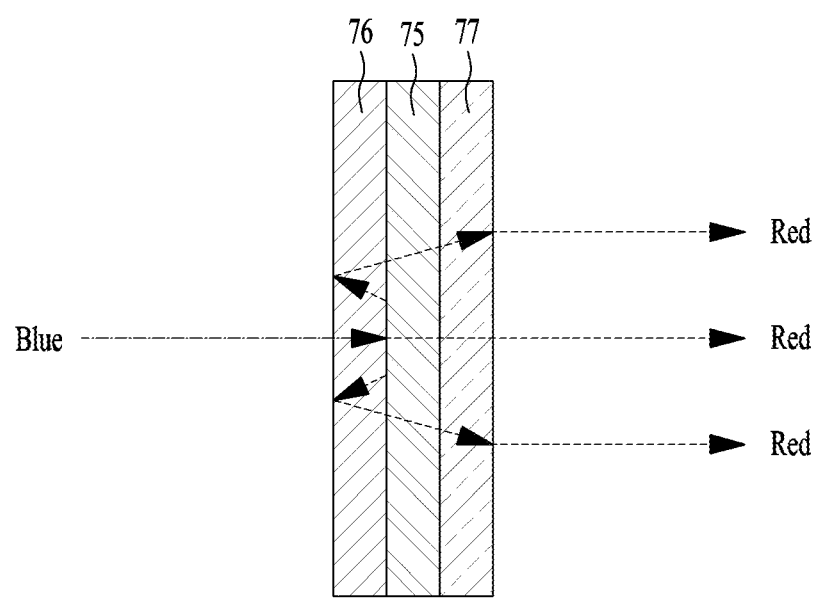
FIG. 12 is a longitudinal-sectional view of a wavelength conversion plate of FIG. 11.

Next, FIG. 11 is a cross-sectional view illustrating a laser light source device 70 in accordance with yet another embodiment of the present invention and FIG. 12 is a longitudinal-sectional view of a wavelength conversion plate 75 of FIG. 11. Differently from the above-described embodiments, in the embodiment shown in FIG. 11, one laser diode 71 is used and, thus, a light quantity is small but a small-sized laser light source device 70 may be implemented.

With reference to FIG. 11, the laser light source device 70 of this embodiment includes the laser diode 71, the wavelength conversion plate 75 and a condensing lens 73.

As described above, a blue laser diode or an ultraviolet laser diode having straightness may be used as the laser diode 71. The wavelength conversion plate 75 is located on the front surface of the laser diode 71, and the condensing lens 73 to prevent spreading of emitted light to emit parallel light is disposed on the front surface of the wavelength conversion plate 75.

The wavelength conversion plate 75 converts blue or ultraviolet light emitted from the laser diode 71 into red, green or yellow light. As described above, light of different colors may be produced according to kinds of wavelength conversion materials included in the wavelength conversion plate 75.

While, in the above-described embodiments, light needs to be reflected by the wavelength conversion plate 20 and, thus, the reflection plate 23 is provided on the rear surface thereof, in this embodiment, light is transmitted by the wavelength conversion plate 75 and emitted in the forward direction.

Here, all of light is not transmitted by the wavelength conversion plate 75 and some of light may be reflected by the wavelength conversion plate 75 in the direction of the laser diode 71. The reflected light is not used and efficiency of the laser light source device 70 may be lowered. Therefore, in the present invention, a first anisotropic coating layer 76 may be formed between the laser diode 71 and the wavelength conversion plate 75 so as to transmit blue or ultraviolet light emitted from the laser diode but to reflect light of a wavelength converted by the wavelength conversion plate 75.

That is, as exemplarily shown in FIG. 12, the first anisotropic coating layer 76 transmits blue light and supplies blue light to the wavelength conversion plate 75 but reflects light, reflected to the laser diode among the light converted by the wavelength conversion plate 75, in the forward direction.

Figure 13:
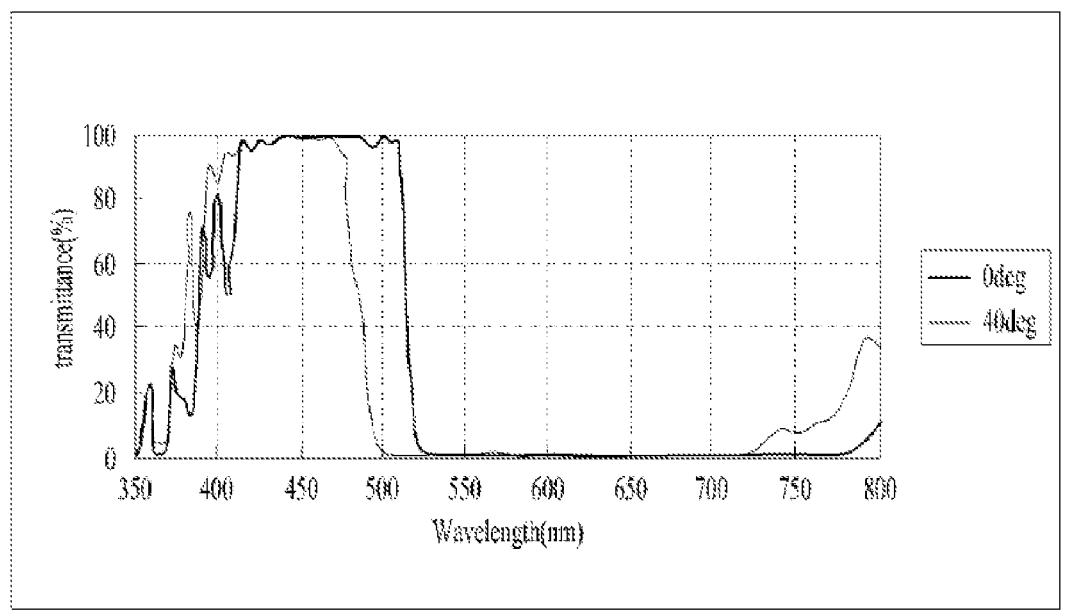
FIG. 13 is a graph representing physical properties of a first coating layer in accordance with the embodiment of FIG. 12.

FIG. 13 is a graph representing physical properties of the first anisotropic coating layer 76, and the first anisotropic coating layer 76 transmits light of a wavelength of about 530 nm or less (blue light or ultraviolet light) but reflects light of a longer wavelength (red, green or yellow light).

Further, a second anisotropic coating layer 77 may be formed on the opposite surface of the wavelength conversion plate 75. The second anisotropic coating layer 77 selects only light of a specific wavelength from among light converted by the wavelength conversion plate 75 and emits the selected light, and serves as a filter to narrow a wavelength band of light emitted from the laser light source device 100.

Figure 14:
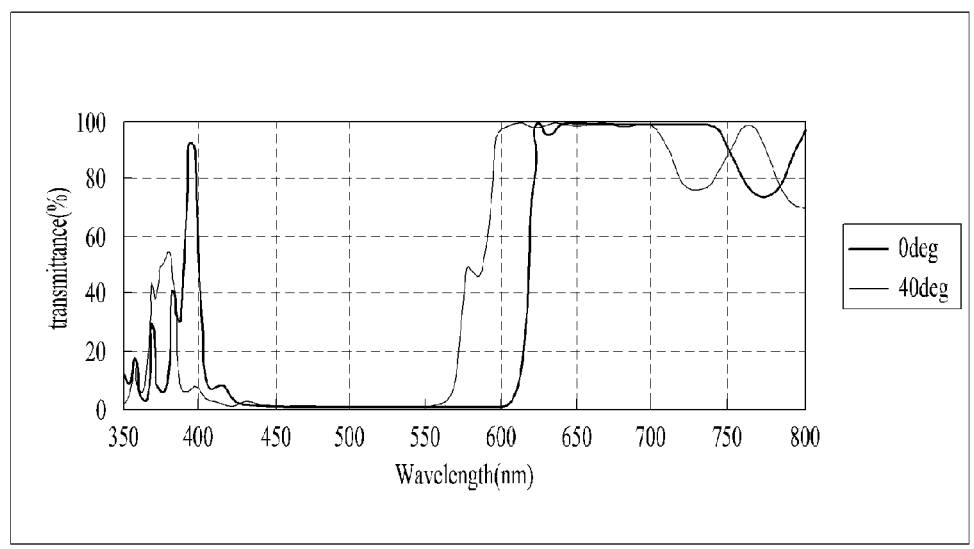
FIG. 14 is a graph representing physical properties of a second coating layer in accordance with the embodiment of FIG. 12.

FIG. 14 is a graph representing physical properties of the second anisotropic coating layer 77. The second anisotropic coating layer 77, which does not transmit light of a wavelength of 600 nm or less so as to correctly emit only red light if the wavelength band of light converted by the wavelength conversion plate 75 is 550 nm to 700 nm, may be used.

The wavelength band of light transmitted by the second anisotropic coating layer 77 may vary according to the wavelength band of light converted by the wavelength conversion plate 75.

In accordance with at least one embodiment of the present invention, a high-power and small-sized laser light source device may be implemented, and a laser light source device having a narrow exit angle may be provided using laser diodes.

It will be apparent to those skilled in the art that various modifications and variations can be made in the present invention without departing from the spirit or scope of the invention.

Thus, it is intended that the present invention cover the modifications and variations of this invention provided they come within the scope of the appended claims and their equivalents.

The invention claimed is:

1. A laser light source device comprising:
   a laser diode configured to emit light;
   a reflection unit configured to reflect the light emitted from the laser diode;
   a wavelength conversion plate configured to receive light reflected by the reflection unit, convert a wavelength of the light reflected by the reflection unit, and reflect light having a converted wavelength, wherein the wavelength conversion plate comprises an optoceramic plate including a phosphor in ceramic material; and
   a projection unit configured to receive light having the converted wavelength reflected by the wavelength conversion plate and emit light in a forward direction.

2. The laser light source device according to claim 1, wherein the wavelength conversion plate and the laser diode are located on a same plane and face in the forward direction.

3. The laser light source device according to claim 2, wherein the laser diode comprises a plurality of laser diodes disposed in a circular shape, and
   wherein the wavelength conversion plate is located at a center of the laser diodes.

4. The laser light source device according to claim 3, wherein the reflection unit has a ring shape or a circular shape at an arrival position of the light emitted from the laser diodes disposed in the circular shape.

5. The laser light source device according to claim 2, wherein the reflection unit comprises an anisotropic coating layer configured to reflect the light of the wavelength emitted from the laser diode and to transmit the light of the wavelength converted by the wavelength conversion plate.

6. The laser light source device according to claim 1, wherein the wavelength conversion plate includes a reflection plate provided on a rear surface of the optoceramic plate.

7. The laser light source device according to claim 6, wherein the reflection plate comprises an aluminum thin film provided with one surface of the reflection plate contacting the optoceramic plate and coated with silver.

8. The laser light source device according to claim 1, wherein the phosphor comprises at least one of a YAG-based phosphor, a LuAG-based phosphor and an oxynitride phosphor.

9. The laser light source device according to claim 1, wherein the wavelength conversion plate has a circular shape and is located on a rotary plate,
wherein the light reflected by the reflection unit is provided to a portion of the wavelength conversion plate on the rotary plate, and
wherein the rotary plate is rotatable so that the portion of the wavelength conversion plate receiving the reflected light is changed.

10. The laser light source device according to claim 1, wherein the projection unit comprises a lens provided at front sides of the laser diode and the wavelength conversion plate.

11. The laser light source device according to claim 10, wherein the reflection unit comprises an anisotropic coating layer located on a portion of the lens and configured to reflect the light of the wavelength emitted from the laser diode and to transmit the light of the wavelength converted by the wavelength conversion plate.

12. The laser light source device according to claim 11, wherein the lens comprises a collimating lens configured to guide the light converted by the wavelength conversion plate so as to emit the light in a straight direction.

13. The laser light source device according to claim 12, wherein the collimating lens includes:
an incidence surface configured to cover the laser diode and the wavelength conversion plate;
an exit surface opposite to the incidence surface and configured to emit the light converted by the wavelength conversion plate in the straight direction; and
a reflective surface configured to reflect converted light incident upon the incidence surface to the exit surface.

14. The laser light source device according to claim 13, wherein the anisotropic coating layer is located on at least a part of the incidence surface.

15. The laser light source device according to claim 11, wherein the lens comprises a plus lens or a condensing lens, and
wherein the anisotropic coating layer is located on one surface of the lens.

16. The laser light source device according to claim 1, wherein the reflection unit comprises a reflecting mirror having a concave reflective surface, and
wherein the projection unit comprises a parabolic mirror located at a circumference of the wavelength conversion plate and configured to emit light reflected by the wavelength conversion plate in the forward direction.

17. The laser light source device according to claim 16, wherein the reflecting mirror includes an opening located at a center of the reflecting mirror and configured to emit light reflected by the parabolic mirror through the opening.

18. The laser light source device according to claim 1, further comprising a radiation fin located at a rear surface of the wavelength conversion plate and a rear surface of the laser diode.

19. The laser light source device according to claim 1, wherein the laser diode comprises a blue laser diode or an ultraviolet laser diode, and
wherein the light of the wavelength converted by the wavelength conversion plate is one of red light, green light and yellow light.

20. A laser light source device comprising:
a laser diode configured to emit light;
a wavelength conversion plate provided at a front surface of the laser diode and configured to convert a wavelength of the light emitted from the laser diode and transmit light having a converted wavelength through the wavelength conversion plate; and
a first anisotropic coating layer provided on a rear surface of the wavelength conversion plate adjacent to the front surface of the laser diode and configured to transmit the light of the wavelength emitted from the laser diode and to reflect light of a wavelength converted by the wavelength conversion plate.

21. The laser light source device according to claim 20, further comprising a second anisotropic coating layer provided on a front surface of the wavelength conversion plate and configured to transmit at least a part of the light of the wavelength converted by the wavelength conversion plate.

22. The laser light source device according to claim 20, wherein the wavelength conversion plate comprises a ceramic plate including a phosphor.

23. The laser light source device according to claim 20, further comprising a condensing lens provided at a front surface of the wavelength conversion plate so as to condense the light of the converted wavelength and to emit the condensed light in parallel.

24. The laser light source device according to claim 20, wherein the light emitted from the laser diode has a wavelength corresponding to blue light or ultraviolet light, and
wherein the light of the wavelength converted by the wavelength conversion plate is one of red light, green light and yellow light.

* * * * *